United States Patent

Oomura

[11] Patent Number: 5,638,218
[45] Date of Patent: Jun. 10, 1997

[54] CATADIOPTRIC PROJECTION APPARATUS

[75] Inventor: Yasuhiro Oomura, Tokyo, Japan

[73] Assignee: Nikon Corporation, Japan

[21] Appl. No.: 350,764

[22] Filed: Dec. 7, 1994

[30] Foreign Application Priority Data

Dec. 7, 1993 [JP] Japan ................... 5-306268

[51] Int. Cl.$^6$ ........................................... G02B 17/00
[52] U.S. Cl. ..................... 359/727; 359/639; 359/640
[58] Field of Search ........................... 359/720, 726,
359/727, 729, 831, 833, 834, 633, 637,
639, 640

[56] References Cited

U.S. PATENT DOCUMENTS

| | | | |
|---|---|---|---|
| 4,953,960 | 9/1990 | Williamson | 359/663 |
| 5,089,913 | 2/1992 | Singh et al. | 359/727 |
| 5,241,423 | 8/1993 | Chiu et al. | 359/727 |

FOREIGN PATENT DOCUMENTS

| | | |
|---|---|---|
| 00465882 | 1/1992 | European Pat. Off. . |
| 0 608 572 A2 | 12/1993 | European Pat. Off. . |
| 5-72478 | 10/1994 | Japan . |

*Primary Examiner*—Scott J. Sugarman
*Attorney, Agent, or Firm*—Pennie & Edmonds

[57] ABSTRACT

Illumination light having passed a pattern formed on a first surface enters a beam splitter directly or through a refracting system. On this occasion, inside the beam splitter, at least part of the illumination light having passed through an entrance surface is transmitted or reflected by a direction changing surface and then passes through an exit/entrance surface. Subsequently, the illumination light first leaving the beam splitter is reflected by a reflective surface of a concave mirror and then again enters the beam splitter. On this occasion, inside the beam splitter, at least part of the illumination light having passed through the exit/entrance surface is reflected or transmitted by the direction changing surface then to pass through an exit surface. The illumination light thus again leaving the beam splitter is projected directly or through a refracting system onto a second surface to form an image of the pattern thereon. Here, an orthogonal projection area of the direction changing surface on the exit/entrance surface is made different from an area of the exit/entrance surface, whereby the beam splitter is constructed in a decreased size.

13 Claims, 5 Drawing Sheets

CATADIOPTRIC PROJECTION APPARATUS

BACKGROUND OF THE INVENTION

1. Field of the Invention

The present invention relates to a catadioptric projection apparatus, for example used in fabricating semiconductor devices or liquid crystal display devices, etc. by the photolithography process, which is suitable as a projection optical system for 1:1 or reduction projection. More particularly, the invention relates to a catadioptric projection apparatus particularly using a reflection system as an element in an optical system, thereby attaining a resolving power of the submicron order in the ultraviolet wavelength region.

2. Related Background Art

The projection exposure apparatus is used in fabricating semiconductor devices or liquid crystal display devices by the photolithography process. The projection exposure apparatus is so arranged to demagnify a pattern formed on a photo-mask or reticle (hereinafter generally referred to as "reticle") through a projection optical system for example at a ratio of about 5:1 to transfer a demagnified image of the pattern onto a substrate (wafer, glass plate or the like) coated with a photosensitive material (photoresist or the like). With an increase in degree of integration for semiconductor elements, demands become increasing for a projection optical system with a higher resolving power for use in the projection exposure apparatus.

To satisfy such demands, it is necessary to shorten the wavelength of illumination light or to increase the numerical aperture (NA) of the projection optical system. However, as the wavelength of illumination light becomes shorter, influence of light absorption increases so as to limit the types of glass materials which can be practically used. Particularly in the wavelength range of illumination light below 300 nm, practically usable glass materials are only synthetic quartz, and fluorite.

In this case, the two materials have respective Abbe's numbers which are too close to each other to correct the chromatic aberration. It is thus very difficult for the projection optical system composed only of a refracting system to correct the chromatic aberration. Also, fluorite is poor in characteristics of change of refractive index with a temperature change, i.e., poor in the so-called temperature characteristics. Further, fluorite has various problems in machining of lens polishing. Therefore, fluorite cannot be used for many parts in the projection optical system. Consequently, it is very difficult to realize a higher resolving power by the projection optical system composed only of the refracting optical system.

On the other hand, an attempt has been made to construct a projection optical system only of a reflection optical system, because the reflection optical system causes no chromatic aberration. In this case, it is necessary that the scale of the projection optical system is increased and that the reflective surface is aspherical. Accordingly, it is also very difficult to construct the projection optical system only of the reflection optical system.

Then, there are various techniques proposed to construct projection apparatus for reduction projection of a combination optical system of a reflecting system and a refracting system, i.e., of a so-called catadioptric optical system. Such a catadioptric optical system employs a beam splitter for change of optical path in order to guide a light beam into or out of the reflecting system.

The beam splitter is shaped in a cube or a truncated pyramid. Thus, an optical path length for light first entering the beam splitter to travel therein is equal or nearly equal to that for light reflected by the reflecting system and again entering the beam splitter to travel therein.

The catadioptric projection apparatus including the cubic beam splitter is described in detail for example in Japanese Laid-open Patent Application No. 4-235516 and Japanese Laid-open Patent Application No. 5-72478. Further, the catadioptric optical system including the beam splitter of truncated pyramid is described in detail for example in Japanese Laid-open Patent Application No. 2-66510.

SUMMARY OF THE INVENTION

In the above conventional catadioptric projection apparatus, in order to increase the numerical aperture of the refracting system, it is necessary to increase the aperture of the reflecting system approximately in proportion to the numerical aperture. There are, however, problems of difficulties in production and a rise in production cost, caused by increasing the size of the beam splitter set in front of the reflecting system in proportion to the aperture thereof.

Further, as the size of the beam splitter is increased simply in proportion to the aperture of the reflecting system, an attenuation rate of the beam passing inside the beam splitter also increases in corresponding with the size of the beam splitter. Thus, there occurs another problem that a necessary amount of exposure cannot be gained.

Therefore, the present invention has been accomplished taking the above problems into account, and an object of the present invention is to provide a catadioptric projection apparatus which has an increased numerical aperture of the refracting system, without increasing the size of the beam splitter in proportion to the aperture of the reflecting system, thus improving the resolving power thereof and thereby keeping a sufficient amount of exposure.

A first catadioptric projection apparatus according to the present invention comprises a beam splitter having (1a) an entrance surface which light enters, (1b) a direction changing surface for reflecting a predetermined portion of the light having entered the inside, (1c) an exit/entrance surface which the light having passed the inside leaves and thereafter again enters, and (1d) an exit surface which the light having again entered and then passed the inside leaves; (2) at least one refracting system of a first refracting system arranged as opposed to the entrance surface of the beam splitter and a second refracting system arranged as opposed to the exit surface of the beam splitter; and (3) a concave mirror arranged as opposed to the exit/entrance surface of the beam splitter; wherein the beam splitter is so constructed that an orthogonal projection area of the direction changing surface on the exit/entrance surface is different from an area of the exit/entrance surface.

In the first catadioptric projection apparatus as so arranged, the light emitted from a certain illumination optical system passes a pattern formed on a first surface to enter the beam splitter directly or through a refracting system. On this occasion, inside the beam splitter, at least part of the light having passed the entrance surface is transmitted or reflected by the direction changing surface then to pass through the exit/entrance surface.

Subsequently, the light first having left the beam splitter is reflected by a reflective surface of the concave mirror and then again enters the beam splitter. On this occasion, inside the beam splitter, at least part of light having passed the exit/entrance surface is reflected or transmitted by the direction changing surface then to pass through the exit surface. The light thus again having left the beam splitter is projected directly or through a refracting system onto a second surface to form an image of the pattern thereon.

Here, where the light is transmitted by the direction changing surface when first passing through the beam splitter and the returning light is reflected by the direction changing surface when again passing through the beam splitter, the direction changing surface is provided between the entrance surface and the exit/entrance surface in such an arrangement that the orthogonal projection area of the direction changing surface on the exit/entrance surface is different from the area of the exit/entrance surface. Because of this arrangement, the light having passed a portion of the entrance surface not overlapping the orthogonal projection area of the direction changing surface when the direction changing surface is orthogonally projected onto the entrance surface, does not pass through the direction changing surface then to pass the exit/entrance surface. Also, part of the light having passed through a portion of the entrance surface overlapping with the orthogonal projection area of the direction changing surface when the direction changing surface is orthogonally projected onto the entrance surface and the exit/entrance surface, does not pass through the direction changing surface then to pass through a portion of the exit/entrance surface which does not overlap with the orthogonal projection area of the direction changing surface.

In another arrangement, where the illumination light is reflected by the direction changing surface when first passing through the beam splitter and the illumination light is transmitted by the direction changing surface when again passing through the beam splitter, the direction changing surface is arranged between the exit/entrance surface and the exit surface in such an arrangement that the orthogonal projection area of the direction changing surface on the exit/entrance surface is different from the area of the exit/entrance surface. Because of this arrangement, the light having passed through a portion of the exit/entrance surface not overlapping with the orthogonal projection area of the direction changing surface when the direction changing surface is orthogonally projected onto the exit/entrance surface, does not pass through the direction changing surface then to pass through the exit surface. Also, part of the light having passed through a portion of the exit surface overlapping with the orthogonal projection area of the direction changing surface when the direction changing surface is orthogonally projected onto the exit/entrance surface and the exit surface, does not pass through the direction changing surface then to pass through the portion of the exit surface not overlapping with the orthogonal projection area of the direction changing surface.

Since the concave mirror has refracting power, there is a difference between an effective diameter of the beam traveling from the beam splitter to the concave mirror and an effective diameter of the beam traveling from the concave mirror and the beam splitter. Thus, either when the illumination light first passes the inside of the beam splitter or when the illumination light again passes the inside of the beam splitter, it passes through at least one portion of the entrance surface, the exit/entrance surface, and the exit surface, not overlapping with the orthogonal projection area of the direction changing surface.

The size of the exit surface can be reduced by such an arrangement that the direction changing surface is arranged between the entrance surface and the exit/entrance surface so that the orthogonal projection area of the direction changing surface on the exit/entrance surface is different from the area of the exit/entrance surface, as described above. Also, by the arrangement that the direction changing surface is provided between the exit/entrance surface and the exit surface so that the orthogonal projection area of the direction changing surface on the exit/entrance surface is different from the area of the exit/entrance surface, the size of the entrance surface can be reduced. Thus, the size of the beam splitter becomes an irreducible minimum, so that the catadioptric optical system has increased degrees of freedom on optical designing.

Accordingly, even in the case where the aperture of the reflecting system is increased in proportion to the numerical aperture of the refracting system, the shape of the beam splitter does not need to be increased in proportion to the numerical aperture of the reflecting system. Thus, the beam splitter can be readily produced at a low cost, and the catadioptric optical system can greatly improve the resolution of the image of the pattern projected from the first surface onto the second surface. Also, the attenuation rate of the light passing through the inside of the beam splitter is decreased because of the reduction of the optical path length, which secures a sufficient amount of exposure for the image of the pattern projected from the first surface onto the second surface. Further, the separation between the beam splitter and the concave mirror is decreased, which decreases the size of the entire catadioptric optical system.

It is preferred that the shape of the beam splitter be determined to satisfy either one of the following conditions, using an optical path length $L_1$, when light first passes the inside of the beam splitter, of the light, an optical path length $L_2$, when light again passes the inside of the beam splitter, of the light, a numerical aperture NA of the second refracting system, and a focal length fm of the concave mirror.

$|L_1-L_2|/L_1>0.05$, $|L_1-L_2|.NA/|fm|>0.015$, $1.5>|L_1-L_2|.NA/|fm|>0.03$

It is also preferred that the apparatus be provided with a first lens group composed of the first refracting system, and a second lens group composed of the second refracting system and that the first lens group guides the light leaving the first surface through the beam splitter to the concave mirror while the second lens group guides the light reflected by the concave mirror and thereafter again passing through the beam splitter into the second surface. In this case, imaging characteristics of the image of the pattern projected from the first surface onto the second surface can flexibly be controlled by decreasing the various aberrations of the catadioptric optical system.

Further, it is preferred that the apparatus be further provided with a third lens group as an optical system additionally set between the beam splitter and the concave mirror. In this case, the imaging characteristics of the image of the pattern projected from the first surface onto the second surface can also be controlled more flexibly by decreasing the various aberrations due to the concave mirror.

A second catadioptric projection apparatus according to the present invention comprises (1) a beam splitter for letting illumination light having entered along an optical axis of a first surface go out along an optical axis of a second surface; (2) at least one refracting system of a first refracting system for converging the illumination light coming from the first surface and letting the converged light go out toward the beam splitter, and a second refracting system for converging the illumination light coming from the beam splitter and letting the converged light go out toward the second surface; and (3) a concave mirror for reflecting and converging the illumination light coming from the beam splitter and letting the converged illumination light again go toward the beam splitter. Here, the beam splitter has (1a) an entrance surface which the illumination light enters, arranged to face the optical axis of the first surface, (1d) an exit surface which the illumination light leaves, arranged to face the optical axis of the second surface, (1b) a direction changing surface comprising a transmitting region for transmitting the illumination light and a reflecting region for reflecting the illumination light, arranged as inclined relative to the respective optical axes of the first surface and the second surface, (1c) an exit/entrance surface for letting the illumination light guided from the entrance surface at least partially through the direction changing surface go out toward the concave mirror and guiding the illumination light entering from the concave mirror at least partially through the direction changing surface to the exit surface, and (1e) a transparent portion which is formed in a region ranging from a position abutting on an edge of the direction changing surface to a periphery side in at least one of the entrance surface, the exit/entrance surface, and the exit surface, which has a same transmittance as that of the direction changing surface for a wavelength of the illumination light, and which gives the illumination light a same phase change as that by the direction changing surface.

In the second catadioptric projection apparatus as so arranged, the illumination light emitted from the predetermined illumination optical system passes the pattern formed on the first surface to enter the beam splitter directly or through a refracting system. On this occasion, inside the beam splitter, at least part of the illumination light having passed the entrance surface is transmitted or reflected by the direction changing surface then to pass through the exit/entrance surface.

Subsequently, the illumination light first having left the beam splitter is reflected by the reflective surface of the concave mirror and then again enters the beam splitter. On this occasion, inside the beam splitter, at least part of the illumination light having passed through the exit/entrance surface is reflected or transmitted by the direction changing surface then to pass through the exit surface. Thus, the illumination light again having left the beam splitter is projected directly or through a refracting system onto the second surface to form an image of the pattern thereon.

Here, where the illumination light is transmitted by the direction changing surface when first passing through the beam splitter and the illumination light is reflected by the direction changing surface when again passing through the beam splitter, the transparent portion is formed in at least one of the entrance surface and the exit/entrance surface. Because of this arrangement, the illumination light having passed through the transparent portion formed on the entrance surface does not pass through the direction changing surface then to pass through the exit/entrance surface. Also, part of the illumination light having passed through the entrance surface does not pass through the direction changing surface then to pass through the transparent portion formed in the exit/entrance surface.

In another arrangement, where the illumination light is reflected by the direction changing surface when first passing through the beam splitter and the illumination light is transmitted by the direction changing surface when again passing through the beam splitter, the transparent portion is formed in at least one of the exit/entrance surface and the exit surface. Because of this arrangement, the illumination light having passed through the transparent portion formed on the exit/entrance surface does not pass through the direction changing surface then to pass through the exit surface. Also, part of the illumination light having passed through the exit/entrance surface does not pass through the direction changing surface then to pass through the transparent portion formed on the exit surface.

These transparent portions have the same transmittance as that of the direction changing surface for the wavelength of the illumination light and give the same phase change as that given by the direction changing surface, to the illumination light. Because of this, the illumination light will have neither amplitude deviation nor phase deviation after having passed through mutually different paths inside the beam splitter.

Since the concave mirror has refracting power, there is a difference between an effective diameter of the beam traveling from the beam splitter to the concave mirror and an effective diameter of the beam traveling from the concave mirror to the beam splitter. Thus, either when the illumination light first passes inside the beam splitter or when the illumination light again passes inside the beam splitter, it passes through the transparent portion formed in at least one of the entrance surface, the exit/entrance surface, and the exit surface.

The size of the exit surface can be reduced by forming the transparent portion in at least one of the entrance surface and the exit/entrance surface, as described above. Also, the size of the entrance surface can be reduced by forming the transparent portion in at least one of the exit/entrance surface and the exit surface. Therefore, the size of the beam splitter becomes an irreducible minimum, which gives the catadioptric optical system increased degrees of freedom on optical designing.

Accordingly, even if the aperture of the reflecting system is increased in proportion to the numerical aperture of the refracting system, the shape of the beam splitter does not need to be increased in proportion to the numerical aperture of the reflecting system. Thus, the beam splitter can be readily produced at a low cost, and the catadioptric optical system can greatly improve the resolution of the image of the pattern projected from the first surface onto the second surface. Additionally, the attenuation rate of the illumination light passing inside the beam splitter is decreased because of the reduction of the optical path length, which secures a sufficient amount of exposure for the image of the pattern projected from the first surface onto the second surface. Further, the distance between the beam splitter and the concave mirror is decreased, which decreases the size of the entire catadioptric optical system.

It is preferred that the shape of the beam splitter be determined to satisfy either one of the following conditions, using an optical path length $L_1$, when light first passes the inside of the beam splitter, of the light, an optical path length $L_2$, when light again passes the inside of the beam splitter, of the light, a numerical aperture NA of the second refracting system, and a focal length fm of the concave mirror.

$|L_1-L_2|/L_1>0.05$, $|L_1-L_2|.NA/|fm|>0.015$, $1.5>|L_1-L_2|.NA/|fm|>0.03$

It is also preferred that the apparatus be provided with a first lens group composed of a first refracting system and a second lens group composed of a second refracting system. In this case, the imaging characteristics of the image of the pattern projected from the first surface onto the second surface can flexibly be controlled by decreasing the various aberrations of the catadioptric optical system.

Further, it is preferred that the apparatus be further provided with a third lens group which is additionally arranged between the beam splitter and the concave mirror, which converges the illumination light coming from the beam splitter and letting the converged light go out toward the concave mirror, and which converges the illumination light coming from the concave mirror and letting the converged light go out toward the beam splitter. In this case, the imaging characteristics of the image of the pattern projected from the first surface onto the second surface can be controlled more flexibly by decreasing the various aberrations due to the concave mirror.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
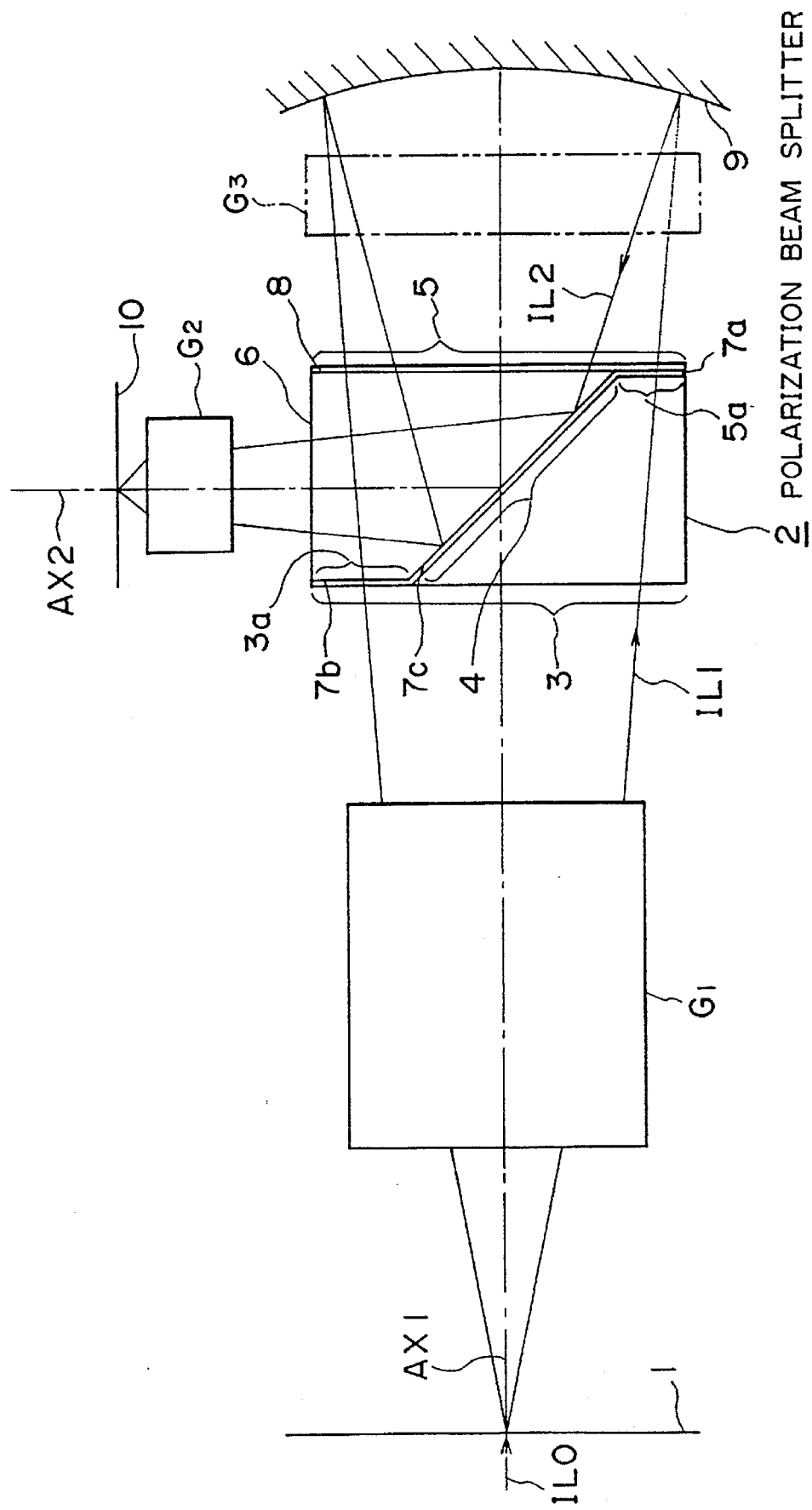
FIG. 1 is an optical path diagram to show the basic structure of a first embodiment of the catadioptric projection apparatus of the present invention.

The construction and operation of the embodiments of the catadioptric projection apparatus according to the present invention will be described referring to FIG. 1 to FIG. 3. In the description of the drawings, the same elements are denoted by the same reference numerals and redundant description will be omitted. It is also noted that ratios of dimensions in the drawings do not always coincide with those in the description.

The following embodiments are those in which the present invention is applied to projection apparatus having a catadioptric optical system for projecting an image of a pattern formed on a reticle onto a wafer coated with a photoresist at a predetermined magnification (including a magnification of 1:1), based on the full exposure method or the slit-scan exposure method. It is intended that these embodiments disclose the details of the catadioptric projection apparatus as a projection optical system and not disclose a stage mechanism or a positioning mechanism fully.

First Embodiment

As shown in FIG. 1, the catadioptric projection apparatus of the present invention is basically constructed as a catadioptric optical system for projecting an image of a pattern formed on an object plane 1 onto an image plane 10. In the catadioptric optical system, there are a first lens group $G_1$, a polarization beam splitter 2, and a concave mirror 9 arranged in order along an input axis AX1 perpendicular to the object plane 1, and the polarization beam splitter 2 and a second lens group $G_2$ arranged in order along an output axis AX2 perpendicular to the input axis AX and the image plane 10.

The object plane 1 is a reticle surface on which a pattern formed as a projected object is set. This object plane 1 is illuminated with a light beam emitted from an illumination optical system (not shown), whereby a light beam reflecting the pattern is projected toward the first lens group $G_1$.

The first lens group $G_1$ is a converging group composed of a plurality of lenses having a common optical axis. The first lens group $G_1$ converges the beam coming from the pattern on the object plane 1 to project the converged beam toward the polarization beam splitter 2. The polarization beam splitter 2 is an optical element composed of two prisms bonded to each other on a polarization beam splitter surfaces. The polarization beam splitter 2 transmits the beam coming from the first lens group $G_1$ toward the concave mirror 9 and reflects the beam coming from the concave mirror 9 toward the second lens group $G_2$.

The concave mirror 9 is a reflecting mirror having a reflective surface which is a spherical surface or an ellipsoidal surface of revolution. This concave mirror 9 reflects and converges the beam coming from the polarization beam splitter 2 to project the converged beam again toward the polarization beam splitter 2.

The second lens group $G_2$ is a converging group composed of a plurality of lenses having a common optical axis. The second lens group $G_2$ converges the beam coming from the polarization beam splitter 2 to project the converged beam onto the image plane 10 to form the image of the pattern thereon.

The image plane 10 is a wafer surface coated with a photoresist as a photosensitive agent. The image plane 10 is illuminated with the focused beam projected from the second lens group $G_2$, whereby the image of the pattern is printed on the photoresist.

More specifically, the polarization beam splitter 2 is constructed of first and second prisms of two frustums which are bonded to each other on slant surfaces to be incorporated approximately in a rectangular parallelepiped. In the surfaces of the polarization beam splitter 2 there are an entrance surface 3 and an exit/entrance surface 5 being perpendicular to the input axis AX1, opposite to each other, and nearly flat, and an exit surface 6 being perpendicular to the output axis AX2 and nearly flat. Inside the polarization beam splitter 2 a direction changing surface 4 inclined at an angle 45° of intersection with the input axis AX1 and the output axis AX2 is formed as to be nearly plane, as the polarization beam splitter surface between the entrance surface 3 and the exit/entrance surface 5.

The both edges of the direction changing surface 4 are connected to positions a predetermined distance inside from diagonally opposing edges of the entrance surface 3 and exit/entrance surface 5. Thus, an orthogonal projection area of the direction changing surface 4 on the exit/entrance surface 5 is set smaller than an area of the exit/entrance surface 5.

In one end portion of the entrance surface 3 a thin film 7b covers a region ranging from the connection position at the one edge of the direction changing surface 4 to the peripheral side. Accordingly, the entrance surface 3 consists of a portion exposing the surface of the first prism and a portion consisting of the thin film 7b as a transparent portion 3a. Also, as the direction changing surface 4, a thin film 7c covers the entire surface of the respective slant surfaces of the first and second prisms. Accordingly, the entire surface of the direction changing surface 4 is integrally formed only of the thin film 7c.

In one end portion of the exit/entrance surface 5, a thin film 7a covers a region ranging from the connection position at the other edge of the direction changing surface 4 to the peripheral side. Further, a quarter wave plate 8 is provided to cover the entire surface of the exit/entrance surface 5 including the thin film 7a. Accordingly, the exit/entrance surface 5 is composed of a portion consisting only of the quarter wave plate 8 and a portion consisting of the connecting thin film 7a as the transparent portion 5a and the quarter wave plate 8. Further, the entire surface of the exit surface 6 is integrally formed to expose the surface of the second prism.

Here, the thin film 7c formed as the direction changing surface 4 transmits linearly polarized light included in an entrance plane including the normal line to the direction changing surface 4 and the normal line to the wavefront, that is, a beam of the p polarization state, and reflects linearly polarized light perpendicular to the said entrance plane, that is, a beam of the s polarization state. Also, the thin films 7b, 7a formed as the transparent portions 3a, 5a, respectively, have a same transmittance as that of the direction changing surface 4 for a wavelength of the beam transmitted by the direction changing surface 4, and transmit the beam as giving a same phase change as that of the beam transmitted by the direction changing surface 4. For example, these thin films 7a, 7b are different in film thickness or index of refraction from the thin film 7c.

The quarter wave plate 8 provided as the exit/entrance surface 5 transmits a beam as giving the linear polarization state an optical phase change of $\pi/2$. After a beam passes through the quarter wave plate 8 twice, it is given an optical phase change of $\pi$, resulting in transition from a first linear polarization state into a second linear polarization state having the direction of vibration perpendicular to that of the first linear polarization state.

Here, the shape of the beam splitter 2 preferably satisfies the following condition (1) or condition (2a).

$$|L_1-L_2|/L_1 > 0.05 \qquad (1)$$

$$|L_1-L_2|.NA/|fm| > 0.015 \qquad (2a)$$

In the above conditions, $L_1$: an optical path length, when a beam first passes inside the polarization beam splitter 2, of the passing beam;

$L_2$: an optical path length, when the beam again passes inside the polarization beam splitter 2, of the passing beam;

NA: a numerical aperture of the second lens group $G_2$;

fm: a focal length of the concave mirror 9.

By satisfying the condition (1) or (2a) as described, the following effects can be achieved: (a) an improvement in transmittance in the overall optical system; (b) a size reduction of the optical system; (c) an improvement in easiness of production and a reduction in production cost of the polarization beam splitter 2 itself.

If the condition (1) or (2a) is not satisfied because of a too small optical path difference $|L_1-L_2|$ in the polarization beam splitter 2, the numerical aperture of the overall optical system needs to be increased by increasing the volume of the polarization beam splitter 2. This raises the original problem to be solved by the present invention. Namely, it causes difficulties on production of the polarization beam splitter 2 itself and a rise of production cost. Also, the transmittance of beam is degraded because of an increase in the optical path length $(L_1+L_2)$ in the polarization beam splitter 2, which results in an enormous change in temperature characteristics due to heat absorption. Further, it increases restrictions on arrangement of the first and second lens groups $G_1$, $G_2$, which decreases degrees of freedom on designing of optical system.

If the condition (2a) is not satisfied because of a too small refracting power $|fm|^{-1}$ of the concave mirror 9, the refracting power of the overall optical system needs to be compensated for by adding a lens group of a refracting system.

If the condition (2a) is not satisfied because of a too small numerical aperture NA of the second lens group $G_2$, it is contrary to the original object to be achieved by the present invention, thus failing to improve the resolving power of the overall optical system.

More particularly, it is more preferable that the shape of the beam splitter 2 satisfy the following condition (2b).

$$1.5 > |L_1-L_2|.NA/|fm| > 0.03 \qquad (2b)$$

By satisfying the condition (2b) as described, the above-described effects (a) to (c) can be achieved more effectively.

If the condition (2b) is not satisfied because of a too large refracting power $|fm|^{-1}$ of the concave mirror 9, aberrations caused in beam by the concave mirror 9 become enormous, which increases loads to correct the aberrations by the first and second lens groups $G_1$, $G_2$.

The operation of the present embodiment is next described.

The illumination light IL0 emitted from the illumination optical system (not shown) illuminates the object plane 1 along the input axis AX1 in the s polarization state. On this occasion, the illumination light IL0 outgoing from the object plane 1 becomes illumination light IL1 reflecting the pattern formed on the object plane 1. The illumination light IL1 is converged by the first lens group $G_1$ to enter the entrance surface 3 of the polarization beam splitter 2.

Subsequently, part of the illumination light IL1 passing through the portion of the entrance surface 3 exposing the surface of the first prism successively passes through the first prism, the direction changing surface 4, and the second prism, and then passes through the portion of the quarter wave plate 8 in the exit/entrance surface 5. On the other hand, the other part of the illumination light IL1 passing through the portion of the entrance surface 3 exposing the surface of the first prism passes through the first prism and then passes through the portion consisting of the connecting transparent portion 5a and the quarter wave plate 8 in the exit/entrance surface 5. Further, the illumination light IL1 passing through the entrance surface 3 consisting of the transparent portion 3a passes through the second prism and then passes through the portion of the quarter wave plate 8 in the exit/entrance surface 5.

Here, the thin films 7a to 7c each have the same transmittance for the wavelength of the illumination light IL1 and are set to give the same phase change to the illumination light IL1. Thus, after having passed through mutually different paths inside the beam splitter 2, beams of the illumination light IL1 have neither amplitude deviation nor phase deviation and are subject to an optical phase change of $\pi/2$ in the linear polarization state by the exit/entrance surface 5.

The illumination light IL1 thus outgoing from the exit/entrance surface 5 is reflected and converged by the spherical surface or the ellipsoidal surface of revolution of the concave mirror 9. On this occasion, the illumination light IL1 reflected by the reflective surface of the concave mirror 9 becomes illumination light IL2 backwardly traveling along the input axis AX1. This illumination light IL2 again enters the exit/entrance surface 5 of the beam splitter 2.

Subsequently, the illumination light IL2 passing through the exit/entrance surface 5 is subject to an optical phase change of π/2 in the linear polarization state by the quarter wave plate 8 so as to change into the p polarization state. This illumination light IL2 travels as being converged along the input axis AX1 in the second prism and then is reflected by the direction changing surface 4, and the reflected light travels as being converged along the output axis AX2 in the second prism so as to pass through the exit surface 6.

The illumination light IL2 thus outgoing from the exit surface 6 is converged through the second lens group $G_2$ to be projected onto the image plane 10 to form the image of the pattern thereon. Thus, the photoresist laid on the image plane 10 is exposed in correspondence with the image of the pattern.

As described, the size of the exit surface 6 is reduced by forming the direction changing surface 4 between the entrance surface 3 and the exit/entrance surface 5 in such an arrangement that the orthogonal projection area of the direction changing surface 4 on the exit/entrance surface 5 is different from the area of the exit/entrance surface 5. In other words, the size of the exit surface 6 is reduced by forming the transparent portions 3a, 5a in at least one of the entrance surface 3 and the exit/entrance surface 5. Because of it, the size of the beam splitter 2 becomes an irreducible minimum, which increases degrees of freedom on optical designing for the catadioptric optical system.

Accordingly, if the aperture of the reflecting system is increased in proportion to the numerical aperture of the refracting system, the shape of the beam splitter 2 does not need to be increased in proportion to the aperture of the reflecting system. This facilitates the production of the beam splitter 2 and decreases the production cost, and the catadioptric optical system can greatly improve the resolution of the image of the pattern projected from the object plane 1 onto the image plane 10. Also, the attenuation rate of the illumination light IL1, IL2 passing inside the beam splitter 2 decreases because of the reduction of optical path length, which secures a sufficient amount of exposure of the image of the pattern projected from the object plane 1 onto the image plane 10. Further, the distance between the beam splitter 2 and the concave mirror 9 is reduced, which decreases the size of the entire catadioptric optical system.

Here, the present embodiment is not limited only to the above description, but may have various modifications.

For example, it is preferable that a third lens group $G_3$ be added between the polarization beam splitter 2 and the concave mirror 9. This third lens group $G_3$ is a converging group composed of a plurality of lenses having a common optical axis. In this case, the third lens group $G_3$ converges a light beam coming from the polarization beam splitter 2 toward the concave mirror 9 and converges a beam coming from the concave mirror 9 toward the polarization beam splitter 2.

In this arrangement, even if the first and second lens groups $G_1$, $G_2$ failed to overcome the aberrations of beam caused by the entire optical system, the aberrations would be compensated for by the third lens group $G_3$. This permits the image of the pattern formed on the image plane 10 to have improved imaging characteristics. The distance between the polarization beam splitter 2 and the third lens group $G_3$ can be made smaller because of the size reduction of the polarization beam splitter 2 than that in the conventional cases.

Without forming the transparent portions 5a, 3a or after the transparent portions 5a, 3a are formed, a thin film having a predetermined thickness distribution or index distribution may be formed to cover the entire surface of the entrance surface 3, thereby compensating for amplitude deviation and phase deviation between the beam having passed the entrance surface 3 and thereafter having passed the direction changing surface 4 and the beam having passed the entrance surface 3 but thereafter not having passed the direction changing surface 4.

Where the transparent portions 5a, 3a are not formed, it is necessary to calculate the amplitude deviation and phase deviation caused when the beams pass through the direction changing surface 4. If the transparent portions 5a, 3a are formed, it is necessary to calculate the amplitude deviation and phase deviation caused when the beams pass through the direction changing surface 4 and to calculate the amplitude deviation and phase deviation caused when the beams pass through the transparent portions 5a, 3a. Then, it is preferable that a thickness distribution or index distribution of the thin film formed over the entire surface of the entrance surface 3 be determined so as to cancel such amplitude deviation and phase deviation.

In another modification, exchanging the locations of the object plane 1 and the image plane 10 for each other, the illumination light IL1 is arranged to enter the exit surface 6 and the illumination light IL2 is arranged to leave the entrance surface 3. In this case, a transparent portion of a thin film needs to be formed on the exit surface 6 without forming the transparent portion of the thin film on the entrance surface 3.

As another modification, the direction changing surface 4 does not need to be formed as a polarization beam splitter surface having a transmitting region for the illumination light on the entire surface of the one side and a reflecting region for the illumination light on the entire surface of the other side, but it may be formed as a simple beam splitter surface having a reflecting region and a transmitting region for the illumination light in the central portion and in the peripheral portion, respectively, on the both sides including the inside.

Further, if a reduction in a quantity of illumination light is acceptable, the polarization beam splitter 2 may be replaced by a normal beam splitter as an optical element for changing the direction of the illumination light. It is noted that the input axis AX1 and the output axis AX2 do not always have to be perpendicular to each other. In addition, the direction changing surface 4 in the polarization beam splitter 2 does not always have to be inclined at an intersection angle 45° relative to the input axis AX1 and the output axis AX2.

Next described is comparison of a difference in structure between the present embodiment and a conventional example.

Figure 3:
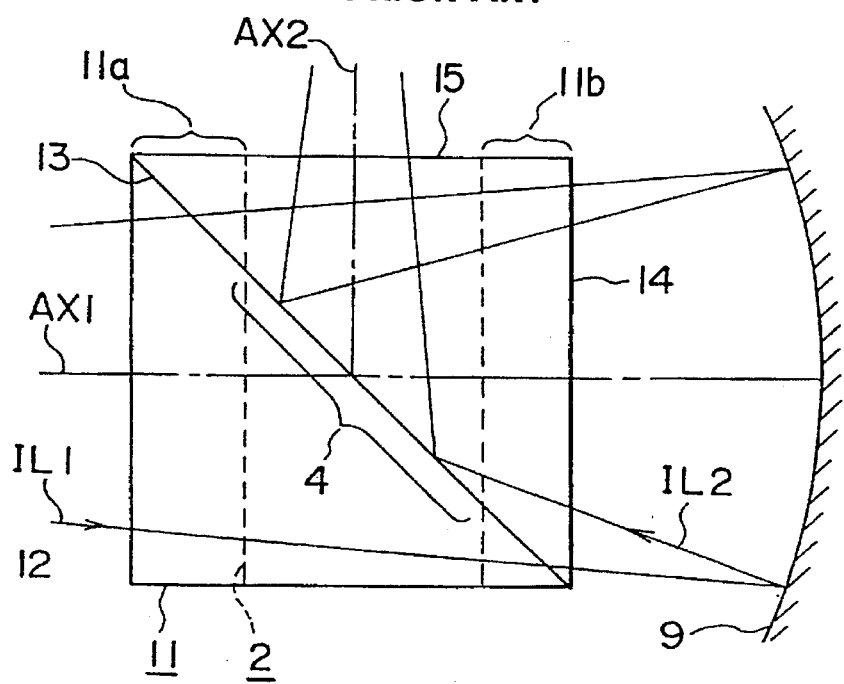
FIG. 3 is an optical path diagram to show the structure of major part of an example of the conventional catadioptric projection apparatus.

Comparing FIG. 1 with FIG. 3, the polarization beam splitter 2 arranged in the catadioptric projection apparatus of the present embodiment is clearly different in structure from the beam splitter 11 arranged in the catadioptric projection apparatus of the conventional example.

As shown in FIG. 3, the beam splitter 11 of the conventional example is an optical element in which first and second prisms of two frustums are bonded to each other on slant surfaces thereof. This beam splitter 11 transmits a beam coming from the first lens group $G_1$ toward the concave mirror 9 and reflects a beam coming from the concave mirror 9 toward the second lens group $G_2$.

More specifically, the beam splitter 11 is shaped approximately in a cube in an incorporated state. In the surfaces of the beam splitter 11, there are an entrance surface 12 and an exit/entrance surface 14 being perpendicular to the input axis AX1, opposite to each other, and approximately flat, and an exit surface 15 being perpendicular to the output axis AX2 and approximately flat. Inside the beam splitter 11 a direction changing surface 13 inclined at an intersection angle 45° relative to the input axis AX1 and the output axis AX2 is formed as to be approximately flat, as a beam splitter between the entrance surface 12 and the exit/entrance surface 14.

The direction changing surface 13 is set on a plane including an edge of the entrance surface 12 and an edge of the exit/entrance surface 14 opposite to each other with respect to the center axis of the beam splitter 11. Namely, the both edges of the direction changing surface 13 are connected to the respective edges of the entrance surface 12 and the exit/entrance surface 14 diagonally opposed to each other. Thus, the orthogonal projection area of the direction changing surface 13 on the exit/entrance surface 14 is nearly equal to the area of the exit/entrance surface 14.

By this arrangement, the optical path length $L_1$ in the beam splitter 11, of a beam first passing through the beam splitter 11 is equal or nearly equal to an optical path length $L_2$ in the beam splitter 11, of a beam again passing through the beam splitter 11. That is, the following equation (3) holds on an approximate basis.

$$|L_1 - L_2| \fallingdotseq 0 \qquad (3)$$

According to such structure, the illumination light IL1 having passed through the entrance surface 12 along the input axis AX1 successively travels through the first prism, the direction changing surface 13, and the second prism then to pass through the exit/entrance surface 14. Subsequently, the illumination light IL1 outgoing from the exit/entrance surface 14 is reflected and converged by the concave mirror 9, and again enters the exit/entrance surface 14 as illumination light IL2 backwardly traveling along the input axis AX1. After that, the illumination light IL2 having passed through the exit/entrance surface 14 travels as being converged along the input axis AX1 in the second prism and then is reflected by the direction changing surface 13. The reflected light travels as being converged along the output axis AX2 in the second prism then to pass through the exit surface 15.

The shape of the polarization beam splitter 2 of the present embodiment is so defined that the both end portions 11a, 11b are cut out from the beam splitter 11 of the conventional example to change the cubic shape into the parallelepiped shape. Therefore, the scale of the polarization beam splitter 2 of the present embodiment is smaller than that of the beam splitter 11 of the conventional example. However, the direction changing surface 4 in the polarization beam splitter 2 is arranged in such a manner that the direction changing surface 13 in the beam splitter 11 is changed into a polarization beam splitter surface from the beam splitter surface.

With the polarization beam splitter 2 different in shape from the beam splitter 11, the illumination light IL1 having passed through the entrance surface 3 includes a beam passing through the direction changing surface 4 and a beam not passing through the direction changing surface 4. In order to make the phases and intensities coincident with each other between these beams, the transparent portions 3a, 5a are formed on the entrance surface 3 and on the exit/entrance surface 5, respectively.

Second Embodiment

Figure 2:
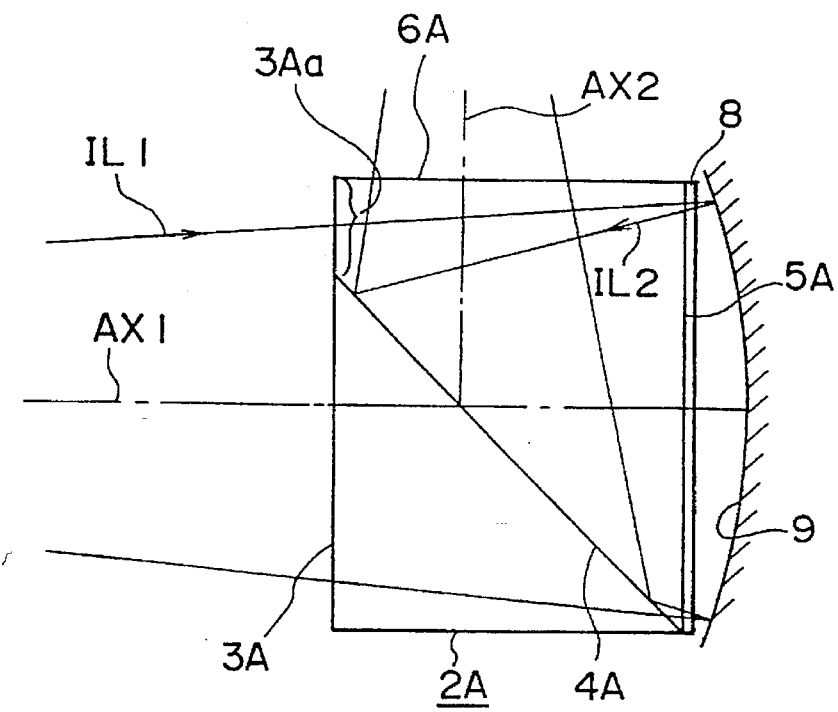
FIG. 2 is an optical path diagram to show the structure of major part of a second embodiment of the catadioptric projection apparatus of the present invention.

As shown in FIG. 2, a catadioptric projection apparatus of the present embodiment is basically constructed substantially in the same manner as in the first embodiment except for a polarization beam splitter 2A.

Here, the polarization beam splitter 2A is an optical element composed of two prisms bonded to each other on a polarization surface. The polarization beam splitter 2A transmits a beam coming from the first lens group $G_1$ toward the concave mirror 9 and reflects a beam coming from the concave mirror 9 toward the second lens group $G_2$.

More specifically, the polarization beam splitter 2A is so constructed that a first prism of a triangular prism and a second prism of a frustum are bonded to each other on slant surfaces thereof to form an incorporated body nearly of a rectangular parallelepiped. In the surfaces of the polarization beam splitter 2A, there are an entrance surface 3A and an exit/entrance surface 5A being perpendicular to the input axis AX1, opposite to each other, and nearly flat, and an exit surface 6A being perpendicular to the output axis AX2 and nearly flat. Inside the polarization beam splitter 2A a direction changing surface 4A inclined at an intersection angle 45° relative to the input axis AX1 and the output axis AX2 is formed as to be nearly flat, as a polarization beam splitter surface between the entrance surface 3A and the exit/entrance surface 5A.

The both edges of the direction changing surface 4A are connected to a position a predetermined distance inside from one edge of the entrance surface 3A and to an edge of the exit surface 5A, respectively, as being diagonally opposite to each other. Thus, the orthogonal projection area of the direction changing surface 4A on the exit/entrance surface 5A is set smaller than the area of the exit/entrance surface 5A.

In one end portion of the entrance surface 3A, a thin film 7b (not shown) is provided to cover a region ranging from the connection position at the one edge of the direction changing surface 4A to the peripheral side. Therefore, the entrance surface 3A consists of a portion exposing the surface of the first prism, and a portion consisting of the thin film 7b as a transparent portion 3Aa.

As the direction changing surface 4A, a thin film 7c (not shown) is provided to cover the entire surface of the slant surfaces of the first and second prisms. Thus, the entire surface of the direction changing surface 4A is integrally constructed only of the thin film 7c.

Further, the entire surface of the exit/entrance surface 5A is covered with a quarter wave plate 8 as integrally formed. Also, the entire surface of the exit surface 6 consists of the exposed surface of the second prism as being integral.

It is preferable that the shape of the beam splitter 2 be determined to satisfy the condition (1) or condition (2a) as described previously, or it is more preferable that it be determined to satisfy the condition (2b) as described previously.

The operation of the present embodiment is next described.

The catadioptric projection apparatus of the present embodiment is operated substantially in the same manner as in the above first embodiment except for the function of the polarization beam splitter 2A.

The illumination light IL1 having passed through the portion of the entrance surface 3A exposing the surface of the first prism successively travels through the first prism, the direction changing surface 4A, and the second prism then to pass through the exit/entrance surface 5A. On the other hand, the illumination light IL1 having passed through the portion of the entrance surface 3A consisting of the transparent portion 3Aa passes through the second prism then to pass through the exit/entrance surface 5A.

Here, the thin films 7b, 7c (not shown) have a same transmittance for the wavelength of the illumination light IL1 and are set to give a same phase change to the illumination light IL1. Thus, beams of the illumination light IL1 having passed through mutually different paths inside the beam splitter 2A have neither amplitude deviation nor phase deviation and are subject to an optical phase change of $\pi/2$ in the linear polarization state by the quarter wave plate 8.

Subsequently, the illumination light IL2 coming from the concave mirror 9 and entering the exit/entrance surface 5A is subject to an optical phase change of $\pi/2$ in the linear polarization state by the quarter wave plate 8 to change into the p polarization state. This illumination light IL2 travels as being converged along the input axis AX1 in the second prism and then is reflected by the direction changing surface 4A. The reflected light travels as being converged along the output axis AX2 in the second prism to pass through the exit surface 6A.

Here, the present embodiment is not limited only to the above description, but may have various modifications.

For example, it is preferred that a third lens group $G_3$ be additionally provided between the polarization beam splitter 2A and the concave mirror 9. This third lens group $G_3$ is a converging group composed of a plurality of lenses having a common optical axis. In this case, the third lens group $G_3$ converges a beam coming from the polarization beam splitter 2A toward the concave mirror 9 and converges a beam coming from the concave mirror 9 toward the polarization beam splitter 2.

In this arrangement, even if the aberrations of beam caused by the overall optical system where not overcome by the first and second lens groups $G_1$, $G_2$, the aberrations would be compensated for by the third lens group $G_3$. Because of it, the image of the pattern formed on the image plane 10 would have imaging characteristics further improved. The distance between the polarization beam splitter 2A and the third lens group $G_3$ can be made smaller by the size reduction of the polarization beam splitter 2A than that in the conventional cases.

Without forming the transparent portion 3Aa or after the transparent portion 3Aa is formed, a thin film having a predetermined thickness distribution or index distribution may be formed to cover the entire surface of the entrance surface 3A, thereby compensating for amplitude deviation and phase deviation between the beam having passed the entrance surface 3A and thereafter having passed the direction changing surface 4A and the beam having passed the entrance surface 3A but thereafter not having passed the direction changing surface 4A.

Where the transparent portion 3Aa is not formed, it is necessary to calculate the amplitude deviation and phase deviation caused when the beams pass through the direction changing surface 4A. If the transparent portion 3Aa is formed, it is necessary to calculate the amplitude deviation and phase deviation caused when the beams pass through the direction changing surface 4A and to calculate the amplitude deviation and phase deviation caused when the beams pass through the transparent portion 3Aa. Then, it is preferable that a thickness distribution or index distribution of the thin film formed over the entire surface of the entrance surface 3A be determined so as to cancel such amplitude deviation and phase deviation.

In another modification, exchanging the locations of the object plane 1 and the image plane 10 for each other, the illumination light IL1 is arranged to enter the exit surface 6A and the illumination light IL2 is arranged to leave the entrance surface 3A. In this case, a transparent portion of a thin film needs to be formed on the exit surface 6A without forming the transparent portion of the thin film on the entrance surface 3A.

As another modification, the direction changing surface 4A does not need to be formed as a polarization beam splitter surface having a transmitting region for the illumination light on the entire surface of the one side and a reflecting region for the illumination light on the entire surface of the other side, but it may be formed as a simple beam splitter surface having a reflecting region and a transmitting region for the illumination light in the central portion and in the peripheral portion, respectively, on the both sides including the inside.

Further, if a reduction in a quantity of illumination light is acceptable, the polarization beam splitter 2A may be replaced by a normal beam splitter as an optical element for changing the direction of the illumination light. It is noted that the input axis AX1 and the output axis AX2 do not always have to be perpendicular to each other. In addition, the direction changing surface 4A in the polarization beam splitter 2A does not always have to be inclined at an intersection angle 45° relative to the input axis AX1 and the output axis AX2.

Next described is comparison of a difference in structure between the present embodiment and the conventional example.

The catadioptric projection apparatus of the conventional example is the same as that in the comparison with the catadioptric projection apparatus of the above first embodiment. Namely, comparing FIG. 2 with FIG. 3, the polarization beam splitter 2A of the present embodiment is clearly different in structure from the beam splitter 11 of the conventional example.

Here, the shape of the polarization beam splitter 2A of the present embodiment is so defined that only one end portion 11a of the beam splitter 11 of the conventional example is cut out to modify the cubic shape into a rectangular parallelepiped shape. Therefore, the polarization beam splitter 2A of the present embodiment is made smaller than the beam splitter 11 of the conventional example. However, the direction changing surface 4A in the polarization beam splitter 2A is arranged in such a manner that the direction changing surface 13 in the beam splitter 11 is changed into a polarization beam splitter surface from the beam splitter surface.

With the polarization beam splitter 2A different in shape from the beam splitter 11, the illumination light IL1 having passed through the entrance surface 3A includes a beam passing through the direction changing surface 4A and a beam not passing through the direction changing surface 4A. Then, the transparent portion 3Aa is formed on the entrance surface 3 in order to make the phases and intensities coincident with each other between these beams.

Now, arrangements of various experimental examples according to the catadioptric projection apparatus of the present invention will be described referring to FIG. 4 to FIG. 6. In the description of the drawings, the same elements will be denoted by the same reference numerals and redundant description will be omitted. It is also noted that ratios of dimensions in the drawings are not always coincident with those in the description.

The following experimental examples are prototyped based on the above second embodiment. It should be noted that these experimental examples are intended to disclose the details of the catadioptric projection apparatus as a projection optical system, but are not intended to disclose fully the stage mechanism or the positioning mechanism.

First Experimental Example

Figure 4:
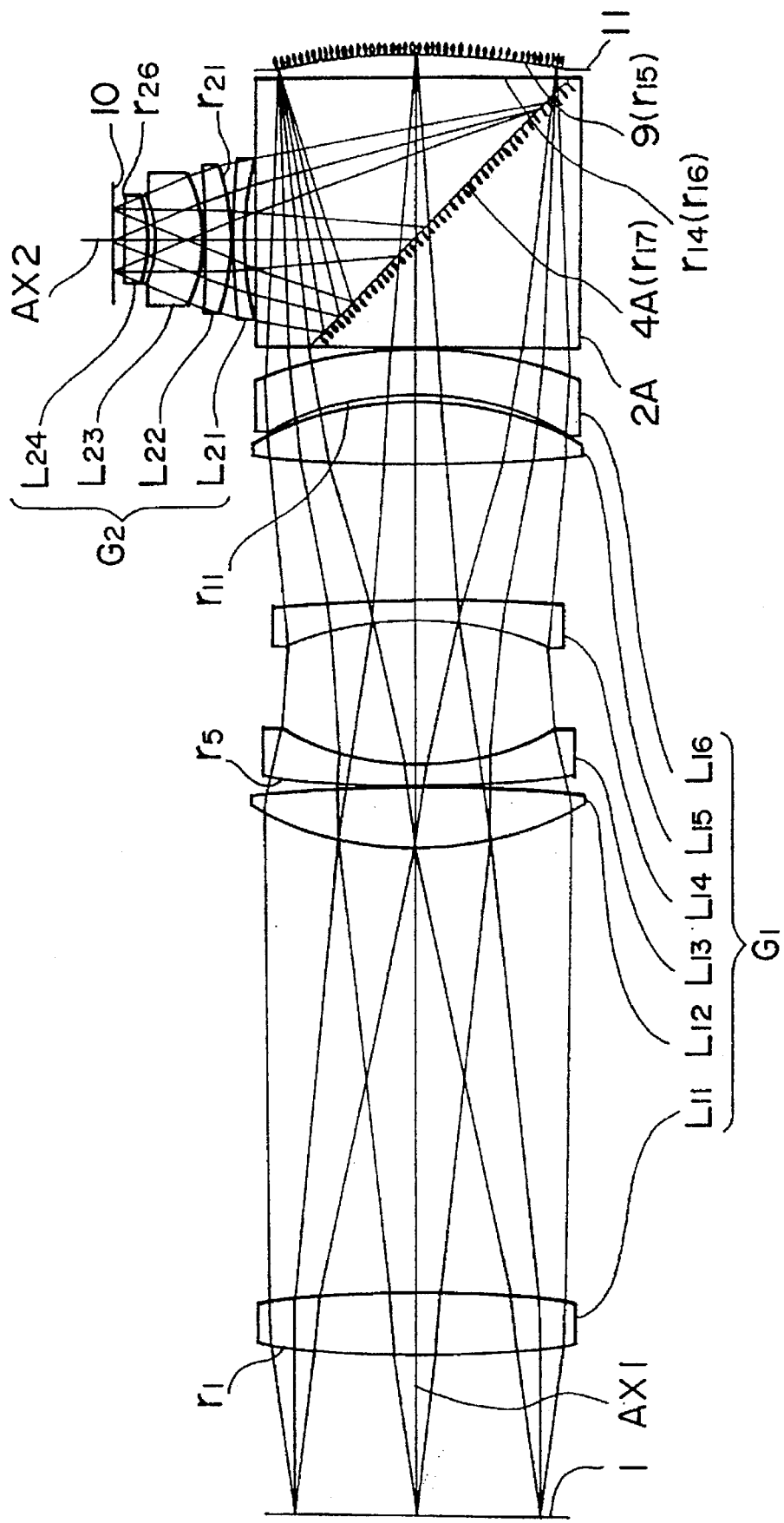
FIG. 4 is an optical path diagram to show the overall structure of a first experimental example of the catadioptric projection apparatus of FIG. 2.

As shown in FIG. 4, a catadioptric projection apparatus of the present experimental example has the first lens group $G_1$, the polarization beam splitter 2A, an aperture 11, and the concave mirror 9 arranged in order along the input axis AX1 perpendicular to the object plane 1, and the polarization beam splitter 2A and the second lens group $G_2$ arranged in order along the output axis AX2 perpendicular to the input axis AX1 and the image plane 10. The aperture 11 is set near the concave mirror 9 in order to prevent the vignetting.

KrF excimer laser light of wavelength 248 nm is used as the illumination light. All lenses in the first and second lens groups $G_1$, $G_2$ and the first and second prisms in the polarization beam splitter 2A are made of same quartz glass having an index of refraction of 1.50855 for the wavelength 248 nm of the illumination light. When rays pass through telecentric paths on the object plane side, the object height is at most 60 nm and the image height is 15 nm with a demagnification ratio of 4:1. When the rays also pass through telecentric paths on the image plane side, the numerical aperture of the optical system is 0.52.

Here, the polarization beam splitter 2A is shaped in a rectangular parallelepiped having the size of 154 ×154×130 (mm$^3$). This size is about 20% smaller than the size of the conventional cubic beam splitter. Values for the respective formula in the condition (1), condition (2a), and condition (2b) as described previously are given as follows, so that this polarization beam splitter 2A satisfies the respective conditions.

$|L_1-L_2|/L_1=0.16$, $|L_1-L_2|\cdot NA/|fm|=0.0525$

In the lens arrangement of the first lens group $G_1$ there are, as being arranged in the named order from the object plane 1 side to the polarization beam splitter 2A side, a double-convex lens (hereinafter generally called simply as "convex lens") $L_{11}$, a convex lens $L_{12}$, a negative meniscus lens $L_{13}$ with a convex surface facing the object plane 1, a negative meniscus lens $L_{14}$ with a concave surface facing the object plane 1, a convex lens $L_{15}$, and a negative meniscus lens $L_{16}$ with a convex surface facing the object plane 1.

In the lens arrangement of the second lens group $G_2$ there are, as being arranged in the named order from the polarization beam splitter 2A side to the image plane 10 side, a negative meniscus lens $L_{21}$ with a concave surface facing the object plane 1, a positive meniscus lens $L_{22}$ with a convex surface facing the object plane 1, a negative meniscus lens $L_{23}$ with a convex surface facing the object plane 1, and a convex lens $L_{24}$.

Tables 1A and 1B show specifications of the present experimental example where the zeroth surface is the object plane (reticle surface) 1 and the i-th surface (i=1, 2, . . . ) is optical surfaces which the beam coming from the object plane 1 successively passes in order before it reaches the image plane (wafer surface) 10. The specifications include the radius of curvature $r_i$ of the i-th surface, the surface separation $d_i$ between the i-th surface and the (i+1)-th surface, a glass material between the i-th surface and the (i+1)-th surface (provided that air is represented by blank), and an effective radius $R_i$ of the lens made of the glass material.

The sign of the radius of curvature $r_i$ is positive when the surface is convex relative to the object plane 1. The sign of the surface separation $d_i$ is positive in the direction going away from the object plane 1. Further, the refractive index of quartz glass is 1.50855 for the wavelength 248 nm of the illumination light.

TABLE 1A

SPECIFICATIONS OF FIRST EXPERIMENTAL EXAMPLE

| SURFACE NO. i | RADIUS OF CURVATURE $r_i$ (mm) | SURFACE SEPARATION $d_i$ (mm) | GLASS MATERIAL | EFFECTIVE RADIUS $R_i$ (mm) |
|---|---|---|---|---|
| 0 | OBJECT PLANE | 79.555 | | |
| 1 | 544.104 | 29.993 | QUARTS GLASS | 73.6 |
| 2 | −690.348 | 220.022 | | 74.5 |
| 3 | 163.698 | 28.363 | QUARTS GLASS | 79.2 |
| 4 | −1454.029 | 0.100 | | 76.2 |
| 5 | 479.752 | 11.550 | QUARTS GLASS | 73.6 |
| 6 | 135.085 | 70.230 | | 66.5 |
| 7 | −162.959 | 9.136 | QUARTS GLASS | 64.5 |
| 8 | −1100.629 | 67.991 | | 68.3 |
| 9 | 914.175 | 30.000 | QUARTS GLASS | 77.8 |
| 10 | −168.863 | 3.853 | | 78.7 |
| 11 | −151.767 | 20.691 | QUARTS GLASS | 75.1 |
| 12 | −255.538 | 2.000 | | 76.8 |
| 13 | ∞ | 130.000 | QUARTS GLASS | |
| 14 | ∞ | 12.000 | | |
| 15 | −315.267 | −12.000 | MIRROR | 69.2 |
| 16 | ∞ | −77.000 | QUARTS GLASS | |
| 17 | DIRECTION CHANGING SURFACE | 77.000 | QUARTS GLASS | |
| 18 | ∞ | 7.240 | | |
| 19 | −210.907 | 8.000 | QUARTS GLASS | 37.9 |
| 20 | −277.733 | 0.150 | | 36.9 |

TABLE 1B

SPECIFICATIONS OF FIRST EXPERIMENTAL EXAMPLE

| SURFACE NO. i | RADIUS OF CURVATURE $r_i$ (mm) | SURFACE SEPARATION $d_i$ (mm) | GLASS MATERIAL | EFFECTIVE RADIUS $R_i$ (mm) |
|---|---|---|---|---|
| 21 | 118.648 | 12.824 | QUARTS GLASS | 34.9 |
| 22 | 862.345 | 0.652 | | 33.2 |
| 23 | 74.314 | 23.151 | QUARTS GLASS | 30.5 |
| 24 | 55.310 | 3.950 | | 21.6 |
| 25 | 76.333 | 11.187 | QUARTS GLASS | 20.6 |
| 26 | −3320.501 | 5.000 | | |

Second Experimental Example

Figure 5:
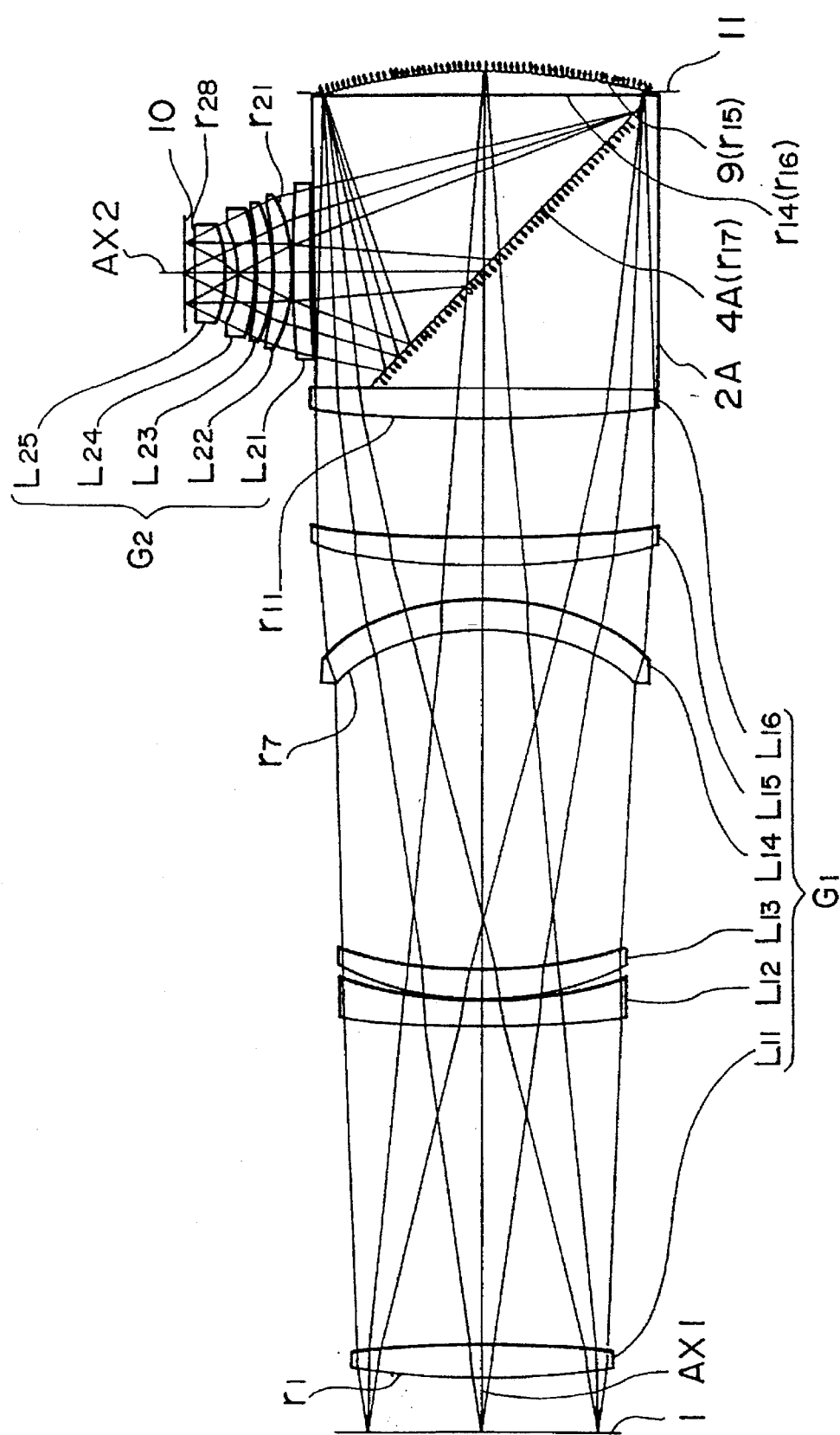
FIG. 5 is an optical path diagram to show the overall structure of a second experimental example of the catadioptric projection apparatus of FIG. 2.

As shown in FIG. 5, a catadioptric projection apparatus of the present experimental example has the first lens group $G_1$, the polarization beam splitter 2A, the aperture 11, and the concave mirror 9 arranged in order along the input axis AX1 perpendicular to the object plane 1, and the polarization beam splitter 2A and the second lens group $G_2$ arranged in order along the output axis AX2 perpendicular to the input axis AX1 and the image plane 10. The aperture 11 is set near the concave mirror 9 in order to prevent the vignetting.

ArF excimer laser light of wavelength 193.3 nm is used as the illumination light. All lenses in the first and second lens groups $G_1$, $G_2$ and the first and second prisms in the polarization beam splitter 2A are made of same quartz glass having an index of refraction of 1.56019 for the wavelength 193.3 nm of the illumination light. When rays pass through telecentric paths on the object plane side, the object height is at most 60 nm and the image height is 15 nm with a demagnification ratio of 4:1. When the rays also pass through telecentric paths on the image plane side, the numerical aperture of the optical system is 0.6.

Here, the polarization beam splitter 2A is shaped in a rectangular parallelepiped having the size of 180 ×180×150 (mm$^3$). This size is about 20% smaller than the size of the conventional cubic beam splitter. Values for the respective formula in the condition (1), condition (2a), and condition (2b) as described previously are given as follows, so that this polarization beam splitter 2A satisfies the respective conditions.

$|L_1-L_2|/L_1=0.18$, $|L_1-L_2|.NA/|fm|=0.0708$

In the lens arrangement of the first lens group $G_1$ there are, as being arranged in the named order from the object plane 1 side to the polarization beam splitter 2A side, a convex lens $L_{11}$, a negative meniscus lens $L_{12}$ with a convex surface facing the object plane 1, a positive meniscus lens $L_{13}$ with a convex surface facing the object plane 1, a negative meniscus lens $L_{14}$ with a concave surface facing the object plane 1, a positive meniscus lens $L_{15}$ with a convex surface facing the object plane 1, and a convex lens $L_{16}$.

In the lens arrangement of the second lens group $G_2$ there are, as being arranged in the named order from the polarization beam splitter 2A side to the image plane 10 side, a negative meniscus lens $L_{21}$ with a concave surface facing the object plane 1, a positive meniscus lens $L_{22}$ with a convex surface facing the object plane 1, a positive meniscus lens $L_{23}$ with a convex surface facing the object plane 1, a negative meniscus lens $L_{24}$ with a convex surface facing the object plane 1, and a positive meniscus lens $L_{25}$ with a convex surface facing the object plane 1.

Tables 2A and 2B show specifications of the present experimental example where the zeroth surface is the object plane (reticle surface) 1 and the i-th surface (i=1, 2, ...) is optical surfaces which the beam coming from the object plane 1 successively passes in order before it reaches the image plane (wafer surface) 10. The specifications include the radius of curvature $r_i$ of the i-th surface, the surface separation $d_i$ between the i-th surface and the (i+1)-th surface, a glass material between the i-th surface and the (i+1)-th surface (provided that air is represented by blank), and an effective radius $R_i$ of the lens made of the glass material.

The sign of the radius of curvature $r_i$ is positive when the surface is convex relative to the object plane 1. The sign of the surface separation $d_i$ is positive in the direction going away from the object plane 1. Further, the refractive index of quartz glass is 1.56019 for the wavelength 193.3 nm of the illumination light.

TABLE 2A

SPECIFICATIONS OF SECOND EXPERIMENTAL EXAMPLE

| SUR-FACE NO. i | RADIUS OF CURVATURE $r_i$ (mm) | SURFACE SEPARA-TION $d_i$ (mm) | GLASS MATERIAL | EFFEC-TIVE RADIUS $R_i$ (mm) |
| --- | --- | --- | --- | --- |
| 0 | OBJECT PLANE | 30.000 | | |
| 1 | 536.013 | 16.544 | QUARTS GLASS | 65.3 |
| 2 | −847.690 | 167.282 | | 65.8 |
| 3 | 568.928 | 15.000 | QUARTS GLASS | 72.7 |
| 4 | 231.891 | 0.100 | | 72.2 |
| 5 | 168.349 | 16.292 | QUARTS GLASS | 73.1 |
| 6 | 256.785 | 178.436 | | 72.3 |
| 7 | −120.385 | 15.000 | QUARTS GLASS | 78.5 |
| 8 | −135.884 | 18.008 | | 83.4 |
| 9 | 376.915 | 15.000 | QUARTS GLASS | 88.2 |
| 10 | 663.107 | 63.216 | | 87.8 |
| 11 | 938.059 | 15.000 | QUARTS GLASS | 89.2 |
| 12 | −6973.121 | 0.100 | | 89.0 |
| 13 | ∞ | 150.000 | QUARTS GLASS | |
| 14 | ∞ | 11.882 | | |
| 15 | −325.736 | −11.882 | MIRROR | 85.3 |
| 16 | ∞ | −90.000 | QUARTS GLASS | |
| 17 | DIRECTION CHANGING SURFACE | 90.000 | QUARTS GLASS | |
| 18 | ∞ | 2.706 | | |
| 19 | −343.777 | 9.500 | QUARTS GLASS | 43.0 |
| 20 | −628.758 | 0.100 | | 41.2 |

TABLE 2B

SPECIFICATIONS OF SECOND EXPERIMENTAL EXAMPLE

| SUR-FACE NO. i | RADIUS OF CURVATURE $r_i$ (mm) | SURFACE SEPARA-TION $d_i$ (mm) | GLASS MATERIAL | EFFEC-TIVE RADIUS $R_i$ (mm) |
| --- | --- | --- | --- | --- |
| 21 | 85.411 | 9.500 | QUARTS GLASS | 38.0 |
| 22 | 143.568 | 0.329 | | 36.0 |
| 23 | 84.172 | 9.500 | QUARTS GLASS | 34.6 |
| 24 | 172.975 | 0.100 | | 32.3 |
| 25 | 106.271 | 9.500 | QUARTS GLASS | 31.2 |
| 26 | 54.694 | 6.720 | | 25.6 |
| 27 | 76.677 | 15.485 | QUARTS GLASS | 23.7 |
| 28 | 1558.617 | 5.000 | | 18.7 |

Third Experimental Example

Figure 6:
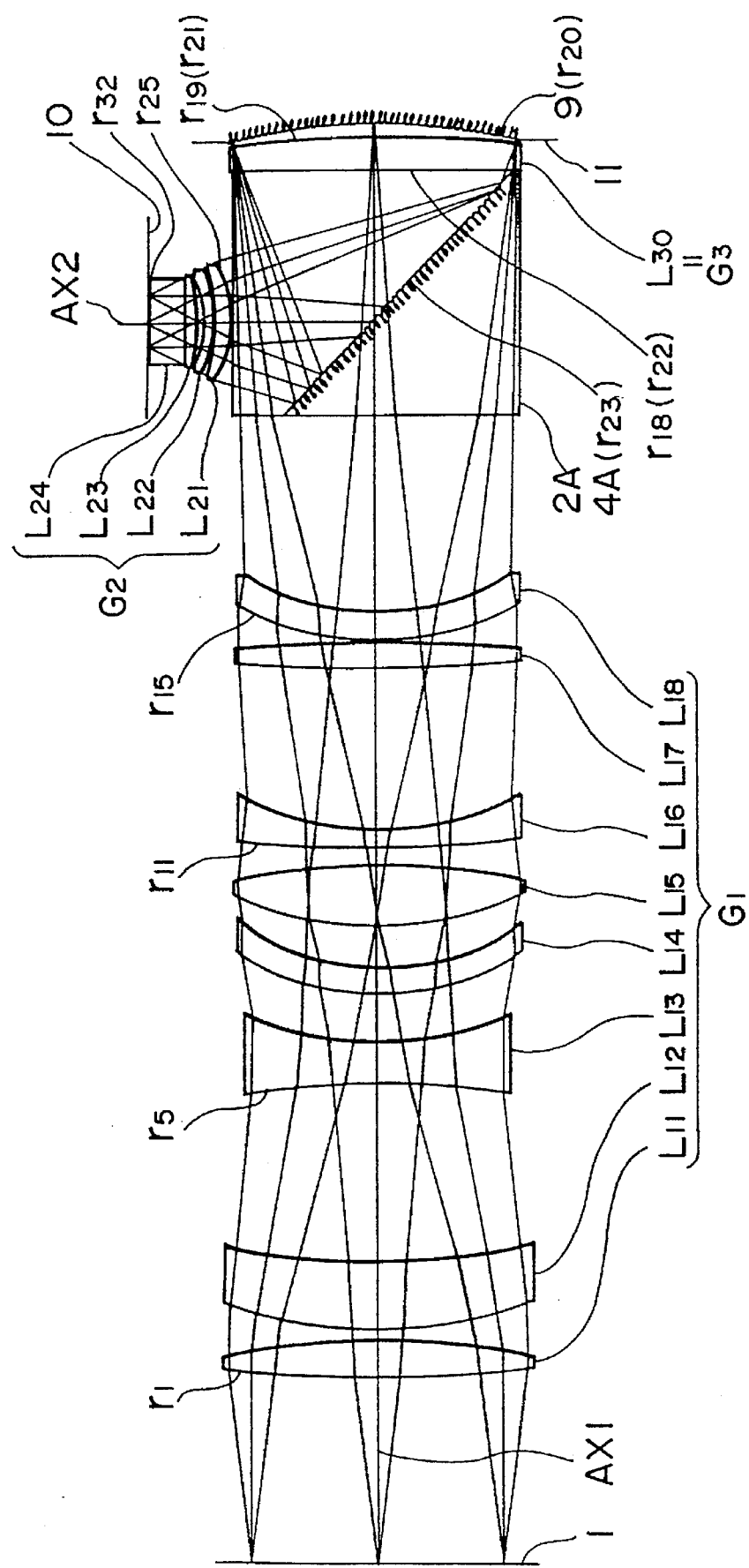
FIG. 6 is an optical path diagram to show the overall structure of a third experimental example of the catadioptric projection apparatus of FIG. 2.

As shown in FIG. 6, a catadioptric projection apparatus of the present experimental example has the first lens group $G_1$, the polarization beam splitter 2A, the aperture 11, the third lens group $G_3$, and the concave mirror 9 arranged in order along the input axis AX1 perpendicular to the object plane i, and the polarization beam splitter 2A and the second lens group $G_2$ arranged in order along the output axis AX2 perpendicular to the input axis AX1 and the image plane 10.

The aperture 11 is set near the concave mirror 9 in order to prevent the vignetting. Also, the third lens group $G_3$ is provided between the polarization beam splitter 2A and the concave mirror 9 in order to improve the imaging characteristics.

KrF excimer laser light of wavelength 248 nm is used as the illumination light. All lenses in the first and second lens groups $G_1$, $G_2$ and the first and second prisms in the polarization beam splitter 2A are made of same quartz glass having an index of refraction of 1.50855 for the wavelength 248 nm of the illumination light. When rays pass through telecentric paths on the object plane side, the object height is at most 70.7 nm and the image height is 14.14 nm with a demagnification ratio of 4:1. When the rays also pass through telecentric paths on the image plane side, the numerical aperture of the optical system is 0.6.

Here, the polarization beam splitter 2A is shaped in a rectangular parallelepiped having the size of 170 ×170×140 (mm$^3$). This size is about 20% smaller than the size of the conventional cubic beam splitter. Values for the respective formula in the condition (1), condition (2a), and condition (2b) as described previously are given as follows, so that this polarization beam splitter 2A satisfies the respective conditions.

$|L_1-L_2|/L_1=0.17$, $|L_1-L_2|\cdot NA/|fm|=0.0673$

In the lens arrangement of the first lens group $G_1$ there are, as being arranged in the named order from the object plane 1 side to the polarization beam splitter 2A side, a convex lens $L_{11}$, a positive meniscus lens $L_{12}$ with a convex surface facing the object plane 1, a double concave lens (hereinafter, generally called simply as "concave lens") $L_{13}$, a negative meniscus lens $L_{14}$ with a convex surface facing the object plane 1, a convex lens $L_{15}$, a negative meniscus lens $L_{16}$ with a convex surface facing the object plane 1, a convex lens $L_{17}$, and a negative meniscus lens $L_{18}$ with a convex surface facing the object plane 1.

In the lens arrangement of the second lens group $G_2$ there are, as being arranged in the named order from the polarization beam splitter 2A side to the image plane 10 side, a positive meniscus lens $L_{21}$ with a convex surface facing the object plane 1, a negative meniscus lens $L_{22}$ with a convex surface facing the object plane 1, a convex lens $L_{23}$, and a negative meniscus lens $L_{24}$ with a concave surface facing the object plane 1.

In the lens arrangement of the third lens group $G_3$, there is a plano-convex lens $L_{30}$ with a plane surface facing the object plane 1. This plane surface of the plano-convex lens $L_{30}$ is fitted with the exit/entrance surface of the beam splitter 2A.

Tables 3A and 3B show specifications of the present experimental example where the zeroth surface is the object plane (reticle surface) 1 and the i-th surface (i=1, 2, . . . ) is optical surfaces which the beam coming from the object plane 1 successively passes in order before it reaches the image plane (wafer surface) 10. The specifications include the radius of curvature $r_i$ of the i-th surface, the surface separation $d_i$ between the i-th surface and the (i+1)-th surface, a glass material between the i-th surface and the (i+1)-th surface (provided that air is represented by blank), and an effective radius $R_i$ of the lens made of the glass material.

The sign of the radius of curvature $r_i$ is positive when the surface is convex relative to the object plane 1. The sign of the surface separation $d_i$ is positive in the direction going away from the object plane 1. Further, the refractive index of quartz glass is 1.50855 for the wavelength 248 nm of the illumination light.

TABLE 3A

SPECIFICATIONS OF THIRD EXPERIMENTAL EXAMPLE

| SURFACE NO. i | RADIUS OF CURVATURE $r_i$ (mm) | SURFACE SEPARATION $d_i$ (mm) | GLASS MATERIAL | EFFECTIVE RADIUS $R_i$ (mm) |
|---|---|---|---|---|
| 0 | OBJECT PLANE | 109.938 | | |
| 1 | 905.902 | 21.468 | QUARTS GLASS | 84.8 |
| 2 | −481.690 | 6.199 | | 84.3 |
| 3 | 279.015 | 40.000 | QUARTS GLASS | 80.2 |
| 4 | 440.354 | 108.173 | | 72.1 |
| 5 | −474.219 | 24.325 | QUARTS GLASS | 72.0 |
| 6 | 207.011 | 26.515 | | 79.0 |
| 7 | 147.320 | 15.819 | QUARTS GLASS | 77.5 |
| 8 | 139.408 | 26.093 | | 81.6 |
| 9 | 206.314 | 35.344 | QUARTS GLASS | 81.5 |
| 10 | −448.575 | 9.545 | | 79.0 |
| 11 | 663.422 | 10.000 | QUARTS GLASS | 76.4 |
| 12 | 178.897 | 97.008 | | 81.4 |
| 13 | 1331.306 | 14.810 | QUARTS GLASS | 81.6 |
| 14 | −1438.568 | 0.100 | | 81.6 |
| 15 | 158.964 | 16.767 | QUARTS GLASS | 78.2 |
| 16 | 140.896 | 117.293 | | 81.4 |
| 17 | ∞ | 140.000 | QUARTS GLASS | |
| 18 | ∞ | 20.000 | QUARTS GLASS | 85.5 |
| 19 | −727.538 | 7.500 | | |
| 20 | −354.636 | −7.500 | MIRROR | 85.8 |

TABLE 3B

SPECIFICATIONS OF THIRD EXPERIMENTAL EXAMPLE

| SURFACE NO. i | RADIUS OF CURVATURE $r_i$ (mm) | SURFACE SEPARATION $d_i$ (mm) | GLASS MATERIAL | EFFECTIVE RADIUS $R_i$ (mm) |
|---|---|---|---|---|
| 21 | −727.538 | −20.000 | QUARTS GLASS | 85.2 |
| 22 | ∞ | −85.000 | QUARTS GLASS | |
| 23 | DIRECTION CHANGING SURFACE | 85.000 | QUARTS GLASS | |
| 24 | ∞ | 1.028 | | |
| 25 | 61.982 | 9.584 | QUARTS GLASS | 32.9 |
| 26 | 104.241 | 0.231 | | 30.6 |
| 27 | 58.925 | 4.902 | QUARTS GLASS | 28.8 |
| 28 | 47.424 | 5.638 | | 25.9 |
| 29 | 101.843 | 7.511 | QUARTS GLASS | 25.3 |
| 30 | −755.266 | 0.963 | | 23.6 |
| 31 | −398.152 | 19.613 | QUARTS GLASS | 23.1 |
| 32 | −477.463 | 0.500 | | 14.7 |

Comparative Example

A catadioptric projection apparatus of the present comparative example was prototyped based on the first embodiment described in Japanese Laid-open Patent Application No. 2-66510 as described previously as the conventional example.

Here, the beam splitter is shaped in a truncated pyramid. Values for the respective formula in the condition (2a) and condition (2b) as described previously are given as follows, and it is seen that the polarization beam splitter 2A does not satisfy the each condition.

$|L_1-L_2|.NA/|fm|=0.0067$

As described, it is intended that the present invention not be limited to the above various examples but may include various arrangements and modifications within the range not departing from the essence of the present invention.

As detailed above, the catadioptric projection apparatus of the present invention is so arranged as to the beam splitter that the direction changing surface is formed between the entrance surface and the exit/entrance surface in such a manner that the orthogonal projection area of the direction changing surface on the exit/entrance surface is different from the area of the exit/entrance surface, which reduces the size of the exit surface. In other words, the size of the exit surface is reduced by forming the transparent portion in at least one of the entrance surface and the exit/entrance surface.

In another arrangement, the direction changing surface is formed between the exit/entrance surface and the exit surface in such a manner that the orthogonal projection area of the direction changing surface on the exit/entrance surface is different from the area of the exit/entrance surface, which reduces the size of the entrance surface. In other words, the size of the entrance surface is reduced by forming the transparent portion in at least one of the exit/entrance surface and the exit surface.

Particularly, it is preferred that the shape of the beam splitter satisfy either one of the above-described conditions (1), (2a), (2b).

Because of it, the size of the beam splitter becomes an irreducible minimum, which increases degrees of freedom on optical designing for the catadioptric optical system. Namely, the size reduction of the beam splitter enables to set another optical member near the beam splitter. In this case, the diameter of the beam handled by the optical member is small, resulting in reducing the entire catadioptric optical system.

If the catadioptric projection apparatus of the present invention is applied to a projection optical system used in exposure apparatus for microlithography requiring a large image-side numerical aperture with selection of light having a shorter wavelength in the ultraviolet region, which is not easy to pass the glass material normally used for the beam splitter, particularly with selection of the excimer laser light as the illumination light, a great advantage of an improvement in throughput in the exposure process can be attained based on the size reduction of the beam splitter and the reduction in attenuation amount of illumination light.

When the catadioptric projection apparatus of the present invention is provided both with the first lens group including the first refracting system disposed between the object plane and the beam splitter and the second lens group including the second refracting system disposed between the beam splitter and the image plane, the imaging characteristics of the image of the pattern projected from the object plane onto the image plane can flexibly be controlled by reducing the various aberrations of the catadioptric optical system.

Further, when the catadioptric projection apparatus of the present invention is further provided with the third lens group additionally disposed between the beam splitter and the concave mirror, the imaging characteristics of the image of the pattern projected from the object plane onto the image plane can be controlled more flexibly by reducing the various aberrations caused by the concave mirror.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 5-306268 filed on Dec. 7, 1993 is hereby incorporated by reference.

What is claimed is:

1. A catadioptric projection apparatus comprising:

a beam splitter for letting illumination light having entered along an optical axis of a first surface go out along an optical axis of a second surface;

at least one refracting system of a first refracting system for converging said illumination light coming from said first surface and letting the converged light go out toward said beam splitter and a second refracting system for converging said illumination light coming from said beam splitter and letting the converged light go out toward said second surface; and a concave mirror for reflecting and converging said illumination light coming from said beam splitter and letting the converged light again go toward said beam splitter, wherein said beam splitter comprises:

an entrance surface which said illumination light enters, arranged to face the optical axis of said first surface;

an exit surface which said illumination light leaves, arranged to face the optical axis of said second surface;

a direction changing surface comprising a transmitting region for transmitting said illumination light and a reflecting region for reflecting said illumination light, arranged as inclined relative to the respective optical axes of said first surface and said second surface;

an exit/entrance surface for letting said illumination light guided from said entrance surface at least partially through said direction changing surface go out toward said concave mirror, and guiding said illumination light coming from said concave mirror at least partially through said direction changing surface to said exit surface; and a transparent portion which is formed in a region ranging from a position abutting on an edge of said direction changing surface to a peripheral side in at least one of said entrance surface, said exit/entrance surface, and said exit surface, which has a same light transmittance as that of said direction changing surface for a wavelength of said illumination light, and which gives a same phase change as that by said direction changing surface, to said illumination light.

2. A catadioptric projection apparatus according to claim 1, wherein a shape of said beam splitter is determined to satisfy the following relation with an optical path length $L_1$, when said illumination light passed inside said beam splitter from said entrance surface to said exit/entrance surface, of said illumination light and an optical path length $L_2$, when said illumination light passed inside said beam splitter from said exit/entrance surface to said entrance surface, of said illumination light:

$|L_1-L_2|/L_1>0.05$.

3. A catadioptric projection apparatus according to claim 1, wherein a shape of said beam splitter is determined to satisfy the following relation with an optical path length $L_1$, when said illumination light passed inside said beam splitter from said entrance surface to said exit/entrance surface, of said illumination light, an optical path length $L_2$, when said illumination light passed inside said beam splitter from said exit/entrance surface to said entrance surface, of said illumination light, a numerical aperture NA of said second refracting system, and a focal length fm of said concave mirror:

$|L_1-L_2|.NA/|fm|>0.015$.

4. A catadioptric projection apparatus according to claim 1, wherein a shape of said beam splitter is determined to satisfy the following relation with an optical path length $L_1$, when said illumination light passed inside said beam splitter from said entrance surface to said exit/entrance surface, of said illumination light, an optical path length $L_2$, when said illumination light passed inside said beam splitter from said exit/entrance surface to said entrance surface, of said illumination light, a numerical aperture NA of said second refracting system, and a focal length fm of said concave mirror:

$1.5>|L_1-L_2|.NA/|fm|>0.03$.

5. A catadioptric projection apparatus according to claim 1, wherein said beam splitter is so arranged that said transmitting region in said direction changing surface transmits said illumination light having entered said entrance surface to guide the illumination light to said exit/entrance surface and said reflecting region in said direction changing surface reflects said illumination light having entered said exit/entrance surface to guide the illumination light to said exit surface.

6. A catadioptric projection apparatus according to claim 1, wherein said beam splitter is so arranged that said reflecting region in said direction changing surface reflects said illumination light having entered said entrance surface to guide the illumination light to said exit/entrance surface and said transmitting region in said direction changing surface transmits said illumination light having entered said exit/entrance surface to guide the illumination light to said exit surface.

7. A catadioptric projection apparatus according to claim 1, further comprising a first lens group comprising said first refracting system, and a second lens group comprising said second refracting system.

8. A catadioptric projection apparatus according to claim 1, further comprising a third lens group additionally provided between said beam splitter and said concave mirror, said third lens group converging said illumination light coming from said beam splitter to let the converged light go out toward said concave mirror, and said third lens group converging said illumination light coming from said concave mirror to let the converged light go out toward said beam splitter.

9. A catadioptric projection apparatus according to claim 1, wherein said beam splitter is a rectangular parallelepiped having a rectangular sectional shape which is perpendicular to said entrance surface and said exit surface.

10. A catadioptric projection apparatus according to claim 9, wherein said beam splitter further comprises a first thin film which is formed on said direction changing surface and functions as a polarization beam splitter surface, and a second thin film which is formed as said transparent portion, which has a same transmittance as that of said first thin film for a wavelength of said illumination light passing through said second thin film and which gives a same phase change as that by the first thin film, to said illumination light passing through said second thin film.

11. A catadioptric projection apparatus comprising:

a beam splitter having an entrance surface which light enters, a direction changing surface for reflecting predetermined part of said light having entered the inside, an exit/entrance surface which said light having passed the inside leaves and thereafter again enters, and an exit surface which said light again having entered and the having passed the inside leaves;

at least one refracting system of a first refracting system arranged as opposed to said entrance surface of said beam splitter and a second refracting system arranged as opposed to said exit surface of said beam splitter; and a concave mirror arranged as opposed to said exit/entrance surface of said beam splitter, wherein said beam splitter is so constructed that an orthogonal projection area of said direction changing surface on said exit/entrance surface is set smaller than an area of said exit/entrance surface, and wherein a shape of said beam splitter is determined to satisfy the following relation with an optical path length $L_1$, when said light passed inside said beam splitter from said entrance surface to said exit/entrance surface, of said light and an optical path length $L_2$, when said light passed inside said beam splitter from said exit/entrance surface to said exit surface, of said light:

$|L_1-L_2|/L_1>0.05$.

12. A catadioptric projection apparatus comprising:

a beam splitter having an entrance surface which light enters, a direction changing surface for reflecting predetermined part of said light having entered the inside, an exit/entrance surface which said light having passed the inside leaves and thereafter again enters, and an exit surface which said light again having entered and the having passed the inside leaves;

at least one refracting system of a first refracting system arranged as opposed to said entrance surface of said beam splitter and a second refracting system arranged as opposed to said exit surface of said beam splitter; and a concave mirror arranged as opposed to said exit/entrance surface of said beam splitter, wherein said beam splitter is so constructed that an orthogonal projection area of said direction changing surface on said exit entrance surface is set smaller than an area of said exit/entrance surface, and wherein a shape of said beam splitter is determined to satisfy the following relation with an optical path length $L_1$, when said light passed inside said beam splitter from said entrance surface to said exit/entrance surface, of said light, an optical path length $L_2$, when said light passed from said exit/entrance surface to said exit surface inside said beam splitter, of said light, a numerical aperture NA of said second refracting system, and a focal length fm of said concave mirror $|L_1-L_2|.NA/|fm|>0.015$.

13. A catadioptric projection apparatus comprising:

a beam splitter having an entrance surface which light enters, a direction changing surface for reflecting predetermined part of said light having entered the inside, an exit/entrance surface which said light having passed the inside leaves and thereafter again enters, and an exit surface which said light again having entered and the having passed the inside leaves;

at least one refracting system of a first refracting system arranged as opposed to said entrance surface of said beam splitter and a second refracting system arranged as opposed to said exit surface of said beam splitter; and a concave mirror arranged as opposed to said exit/entrance surface of said beam splitter, wherein said beam splitter is so constructed that an orthogonal projection area of said direction changing surface on said exit/entrance surface is set smaller than an area of said exit/entrance surface, and wherein a shape of said beam splitter is determined to satisfy the following reaction with an optical path length $L_1$, when said light passed inside said beam splitter from said entrance surface to said exit/entrance surface, of said light, an optical path length $L_2$, when said light passed inside said beam splitter from said exit/entrance surface to said exit surface, of said light, a numerical aperture NA of said second refracting system, and a focal length fm of said concave mirror:

$1.5 > |L_1 - L_2|.NA/|fm| > 0.03$.

* * * * *